United States Patent [19]
Takaishi

[11] Patent Number: 5,777,499
[45] Date of Patent: Jul. 7, 1998

[54] DIGITAL FREQUENCY CONTROL CIRCUIT PHASE CONTROL CIRCUIT AND PLL CIRCUIT

[75] Inventor: Toru Takaishi, Kawasaki, Japan

[73] Assignee: Fujitsu Limited, Kawasaki, Japan

[21] Appl. No.: 630,594

[22] Filed: Apr. 10, 1996

[30] Foreign Application Priority Data

Sep. 19, 1995 [JP] Japan ................... 7-240320

[51] Int. Cl.$^6$ ................... H03L 7/06; H03L 7/08
[52] U.S. Cl. ................... 327/159; 327/150; 327/151; 327/160
[58] Field of Search ................... 327/147, 150, 327/151, 155–156, 159, 160; 375/374–376; 331/17, 25

[56] References Cited

U.S. PATENT DOCUMENTS

| | | | |
|---|---|---|---|
| 3,893,040 | 7/1975 | Harp | 331/14 |
| 4,206,414 | 6/1980 | Chapman | 327/160 |
| 4,242,639 | 12/1980 | Boone | 327/160 |
| 4,538,119 | 8/1985 | Ashida | 327/160 |
| 4,577,163 | 3/1986 | Culp | 327/159 |
| 5,343,169 | 8/1994 | Debaty | 331/17 |
| 5,382,921 | 1/1995 | Estrada et al. | 327/159 |
| 5,399,985 | 3/1995 | Awata et al. | 327/159 |
| 5,461,345 | 10/1995 | Taki | 327/160 |
| 5,475,718 | 12/1995 | Rosenkranz | 327/147 |
| 5,608,355 | 3/1997 | Noguchi | 327/151 |

FOREIGN PATENT DOCUMENTS

| | | |
|---|---|---|
| 0091200 A2 | 10/1983 | European Pat. Off. . |
| 5227017 A | 9/1993 | Japan . |

Primary Examiner—Timothy P. Callahan
Assistant Examiner—T. T. Lam
Attorney, Agent, or Firm—Staas & Halsey

[57] ABSTRACT

An oscillating circuit 30 outputs a signal $\phi_o$ whose pulse cycle T is a linear function T=kS+m of a control input value S. A frequency control circuit 10, every time a counter 11 counts a number Nr of pulses of a reference signal $\phi_r$, calculates S=No−m/k, where No is a count of $\phi_o$ counted by the counter 12, makes a judgement on convergence of $\phi_o$ based upon the difference between input and output values of a register 14, makes the register 14 hold S, updates Nr=S+m/k and clears the counter 12 to 0. A digital phase control circuit 20 judges a advance/delay of the phase of $\phi_o$ relative to $\phi_r$ with a phase comparator circuit 21, decrements/increments a count with a counter circuit 22 every time a judgement on the advance/delay of the phase is made and when the result of the judgement on the advance/delay of the phase is reversed from the previous result of that, changes the count to a value that is half the number of times that the same judgement was made successively before the reversal.

19 Claims, 13 Drawing Sheets

5,777,499

1

DIGITAL FREQUENCY CONTROL CIRCUIT PHASE CONTROL CIRCUIT AND PLL CIRCUIT

BACKGROUND OF THE INVENTION

1. Field of the Invention

The present invention relates to a digital frequency control circuit, a digital phase control circuit and a digital phase-locked loop (PLL) circuit having one of these circuits, and semiconductor integrated circuit having one of these circuits.

2. Description of the Related Art

In an analog PLL circuit, if noise is added to the input of a voltage-controlled oscillator (VCO), the frequency and the phase of its output change. Since a low source voltage is used in PLL circuits that operate at high frequency, the noise margin becomes very narrow. These factors make it difficult to increase the accuracy of the output signals in an analog PLL circuit, with the upper limit being approximately 100 MHz.

On the other hand, in a digital PLL circuit, there are a digital logic circuit type and a digital signal processing type.

In the digital logic circuit type, one method uses two frequency-fixed oscillators and switches between them. In another method, one frequency-fixed oscillator is used, and pulses are added or removed relative to its output. However, in either method, the frequency and the phase both change suddenly, necessitating the addition of a frequency divider circuit at the output to average the changes and this makes it difficult to perform phase control to a high degree of accuracy in the high frequency range.

In a digital signal processing type, analog input signals are binary coded with an A/D converter so that they can be processed as digital signals. In this processing, which is performed in real time, the range of possible digital calculation and processing is limited. In other words, since all the processing must be performed during the period of one sampling, the upper limit of the sampling frequency is restricted.

SUMMARY OF THE INVENTION

Accordingly, a first object of the present invention is to provide a digital PLL circuit that can be employed in higher frequency ranges, a digital frequency control circuit and a digital phase control circuit that are used in this digital PLL circuit.

A second object of the present invention is to provide a digital PLL circuit which can perform control at a higher degree of accuracy, a digital frequency control circuit and a digital phase control circuit that are used in the digital PLL circuit.

According to the 1st aspect of the present invention, as shown in FIG. 1A for example, there is provided a digital frequency control circuit (10) for controlling in such a way that a frequency of an output signal of an oscillating circuit (30) approaches a frequency of a reference signal, a pulse cycle T of the output signal being approximately a liner function of a control input value S, namely T=kS+m, comprising: a first counter (11) for counting pulses of the reference signal; a second counter (12) for counting pulses of the output signal as a feedback signal; a register for holding the control input value S; and a calculation & control circuit (13, 15 and 17) for, at every time the first counter have counted a number Nr of pulses, calculating S=No−m/k, where No being a count of the second counter,

2 making the register hold S and for equalizing the number Nr for a next value to No.

In the 1st aspect of the present invention, a first counter is used as a timer and each time the first counter counts a number Nr of pulses. S=No−m/k is held in the register and a next number Nr is made to equal No and since it is not necessary to perform processing for each pulse of the reference signal or an output signal from the oscillating circuit, it can be used in a high frequency range.

In addition, as will become obvious in the explanation of the embodiments to follow, S, in principle, becomes completely converged when S is set twice in the register and since the output signal frequency of the oscillating circuit changes continuously relative to changes in S, the frequency control can be performed at a higher degree of accuracy.

In the 1st mode of the 1st aspect of the present invention, as shown in FIG. 1A for example, the calculation & control circuit includes: a first calculating circuit (13) for calculating S=No−m/k; a second calculating circuit (15) for calculating Nr=S+m/k; and a control circuit (17) for, at every time the first counter have counted the number Nr of pulses, making the register hold an output of the first calculating circuit, equalizing the number Nr for the next value to an output of the second calculating circuit and clearing the second counter to 0.

m/k corresponds to Tc/k−Sc in FIG. 1(B).

With the 1st mode, since the initial value of Nr is determined by setting the initial value of S in the register (14) and a second counter only has to be cleared to 0, the initial setting can be performed easily.

In the 2nd mode of the 1st aspect of the present invention, the calculation & control circuit, as shown in FIG. 12 for example, includes: a calculating circuit (13) for calculating Nr=No−m/k; and a control circuit (17A) for, at every time the first counter have counted the number Nr of pulses, making the register hold an output of the calculating circuit, equalizing the number Nr for a next value to the count No and clearing the second counter to 0.

With the 2nd mode, since the second calculating circuit is not required, the structure is simplified.

In the 3rd mode of the 1st aspect of the present invention, the calculation & control circuit, as shown in FIG. 13 for example, includes: a calculating circuit (15) for calculating Nr=S+m/k; and a control circuit (17B) for, at every time the first counter have counted the number Nr of pulses, making the register hold a count of the second counter, equalizing the number Nr for a next value to an output of the calculating circuit and loading −m/k to the second counter.

With the 3rd mode, since the first calculating circuit is not required, the structure is simplified.

In the 4th mode of the 1st aspect of the present invention, the first calculating circuit, as shown in FIG. 4 for example, includes a buffer register (131) for holding No; and the control circuit (17) causes the first calculating circuit to execute calculation by making the buffer register hold No at every time the first counter (11) have counted a number Nr of pulses.

With the 4th mode, even when the frequency of pulses counted at the second counter is high, at, for instance, 200 MHz, the calculation can be executed because of holding No in the buffer register. In addition, the calculation is executed only when No is held in the register 131, reducing the power consumption in the calculating circuit.

In the 5th mode of the 1st aspect of the present invention, the second calculating circuit includes a buffer register for holding Nr; and the control circuit causes the second calculating circuit to execute calculation by making the buffer register hold Nr at every time the first counter have counted a number Nr of pulses.

In the 6th mode of the 1st aspect of the present invention, as shown in FIG. 1(A) for example, there is further provided a convergence judging circuit (16) for judging whether or not the frequency of the feedback signal relative to a frequency of the reference signal has converged based upon a absolute value of a difference between an input value and an output value of the register at every time the first counter have counted the number Nr of pulses.

With the 6th mode, the judgement on convergence is facilitated since it can be performed according to the absolute value of the difference between the input value and the output value in the register (14). The fact that the judgement on convergence is enabled will be made clear in the explanation of the embodiments.

In the 7th mode of the 1st aspect of the present invention, the calculation & control circuit, at every time the first counter outputs a carry-out signal, calculates MAX–Nr, where MAX is a maximum count value of the first counter, and loads the first counter with MAX–Nr; and the first counter is a up-counter.

With the 7th mode, a carry-out signal from the first counter makes it easy to discern that the first counter has counted pulses up to the number Nr.

In the 8th mode of the 1st aspect of the present invention, the first counter is a down-counter; and the calculation & control circuit loads the first counter with No at every time a count of the first counter has reached 0.

With the 8th mode, it is not necessary to calculate MAX–Nr.

According to the 2nd aspect of the present invention, as shown in FIG. 1(A) for example, there is provided a digital phase control circuit (20) for controlling a phase error between a phase of an output signal of an oscillating circuit (30) and a phase of a reference signal, a pulse cycle of the output signal being changed in response to a control input value S, the digital phase control circuit comprising: a phase comparator circuit (21) for judging a advance/delay of a phase of the output signal as a feedback signal relative to a phase of the reference signal; and a counter circuit (22) for counting up or down according to a judgement of the phase comparator circuit and for changing a count, when the judgement has reversed, to approximately a mean value of the counts which correspond to all of successive same judgements, the count being used as the control input value S.

With the 2nd aspect according to the present invention when the result of judgement on the advance/delay of the phase is reversed from the previous result, the count on the counter circuit is changed to a value that is approximately a mean value of the counts which correspond to all of successive same judgements. Thus, the frequency error Δθ between the frequency of the feedback signal ø_o and the frequency of the reference signal ø_r, when the result of the judgement on the advance/delay of the phase is the reverse of that in the previous result, is reduced. In addition, since the frequency of the signal output from the oscillating circuit changes continuously relative to changes in S, the accuracy with which the phase control is performed is improved.

In the 1st mode of the 2nd aspect of the present invention the comparator circuit judges an advance/delay of the phase of the feedback signal relative to the phase of the reference signal, with a timing of an edge of a pulse of either the reference signal or the feedback signal, by detecting a logical level of the other pulse of the reference signal and the feedback signal.

In the 2nd mode of the 2nd aspect of the present invention, as shown in FIGS. 6 and 7 for example, the phase comparator circuit (21) outputs a first pulse (IDCK) when the judgement is performed, outputs a status signal (ID) holding a result of the judgement and outputs a second pulse (*IDCHG) when the status signal has changed.

With the 2nd mode, the second pulse (*IDCHG) can be used as a timing pulse for changing the count described above.

In the 3rd mode of the 2nd aspect of the present invention, as shown in FIG. 6 for example, the counter circuit (22) includes: a ½ frequency divider circuit (223) having an input for receiving the first pulse and having an output for providing a third pulse; a first up/down counter (221) having an up/down mode input for receiving the status signal, having a clock input for receiving the third pulse and having a load control input for receiving the second pulse; and a second up/down counter (222) having an up/down mode input for receiving the status signal, having a clock input for receiving the first pulse, having a load control input for receiving the second pulse, having a parallel data input for receiving a count of the first up/down counter and having a parallel data output for providing the count of counter circuit as the control input value S.

With the 3rd mode, since it is not necessary to perform calculation to determine approximately a mean value of the counts which correspond to all of successive same judgements, faster processing becomes possible.

According to the 3rd aspect of the present invention, as shown in FIG. 1 for example, there is provided a digital PLL circuit comprising: an oscillating circuit (30) for providing output signal, a pulse cycle T of the output signal being changed in response to a control input value S; a phase comparator circuit (21) for judging an advance/delay of a phase of the output signal as a feedback signal relative to a phase of a reference signal; and a counter circuit (22) for counting up or down according to a judgement of the phase comparator circuit and for changing a count, when the judgement has reversed, to a value that is approximately a mean value of the counts which correspond to all of successive same judgements, the count being used as the control input value S.

In the 1st mode of the 3rd aspect of the present invention, the pulse cycle T of the output signal being approximately a liner function of the control input value S, namely T=kS+m.

In the 2nd mode of the 3rd aspect of the present invention, there is further provided; a first counter for counting pulses of the reference signal; a second counter for counting pulses of the feedback signal; a register for holding the control input value S; a convergence judging circuit for judging whether or not a frequency of the feedback signal relative to a frequency of the reference signal has converged; and a calculation & control circuit for, at every time the first counter have counted a number Nr of pulses, making the register hold S=No−m/k, where No being a count number of the second counter and equalizing the number Nr for a next value to No, for selecting an output of the register as the control input value S before a convergence judgement of the frequency is made and for selecting an output of the counter circuit as the control input value S after the convergence judgement of the frequency is made.

According to the 4th aspect of the present invention, there is provided a digital PLL circuit comprising: an oscillating circuit for providing output signal, a frequency of the output signal being changed in response to a control input value S; a digital frequency control circuit, providing a first control signal in response to the frequency of the output signal, for controlling in such a way that the frequency of the output signal approaches a frequency of a reference signal; a frequency convergence judgement circuit for judging a convergence of the first control signal; a phase comparator circuit for judging advance/delay of a phase of the output signal relative to a phase of a reference signal; and a counter circuit counting up or down a count according to a judgement of the phase comparator circuit, the counter circuit providing the first control signal as the control input value S during the frequency convergence judgement circuit not judging the convergence of the first control signal, the counter providing the count as the control input value S after the frequency convergence judgement circuit having judged the convergence of the first control signal.

According to the 5th aspect of the present invention, there is provided a semiconductor device comprising: a first counter for counting pulses of a reference signal; a second counter for counting pulses of a feedback signal; a register for holding the control input value S; and a calculation & control circuit for, at every time the first counter have counted a number Nr of pulses, calculating S=No−m/k, where No being a count of the second counter, making the register hold S and for equalizing the number Nr for a next value to No.

According to the 6th aspect of the present invention, there is provided a semiconductor device comprising: a phase comparator circuit for judging an advance/delay of a phase of a feedback signal relative to a phase of a reference signal; and a counter circuit for counting up or down according to a judgement of the phase comparator circuit and for changing a count, when the judgement has reversed, to a value that is approximately a mean value of the counts which correspond to all of successive same judgements.

BRIEF DESCRIPTION OF THE DRAWINGS

FIGS. 9(A) and 9(B) show the results of a simulation performed with the reference signal frequency fr=200 MHz (cycle Tr=5 nsec). FIG. 9 (A) is a diagram of the change in the phase error $\Delta\theta$ of the feedback signals relative to the reference signal $\phi_r$ and FIG. 9(B) is a diagram showing a change in the cycle To of the feedback signal $\phi_o$.

DESCRIPTION OF THE PREFERRED EMBODIMENTS

Figure 1:
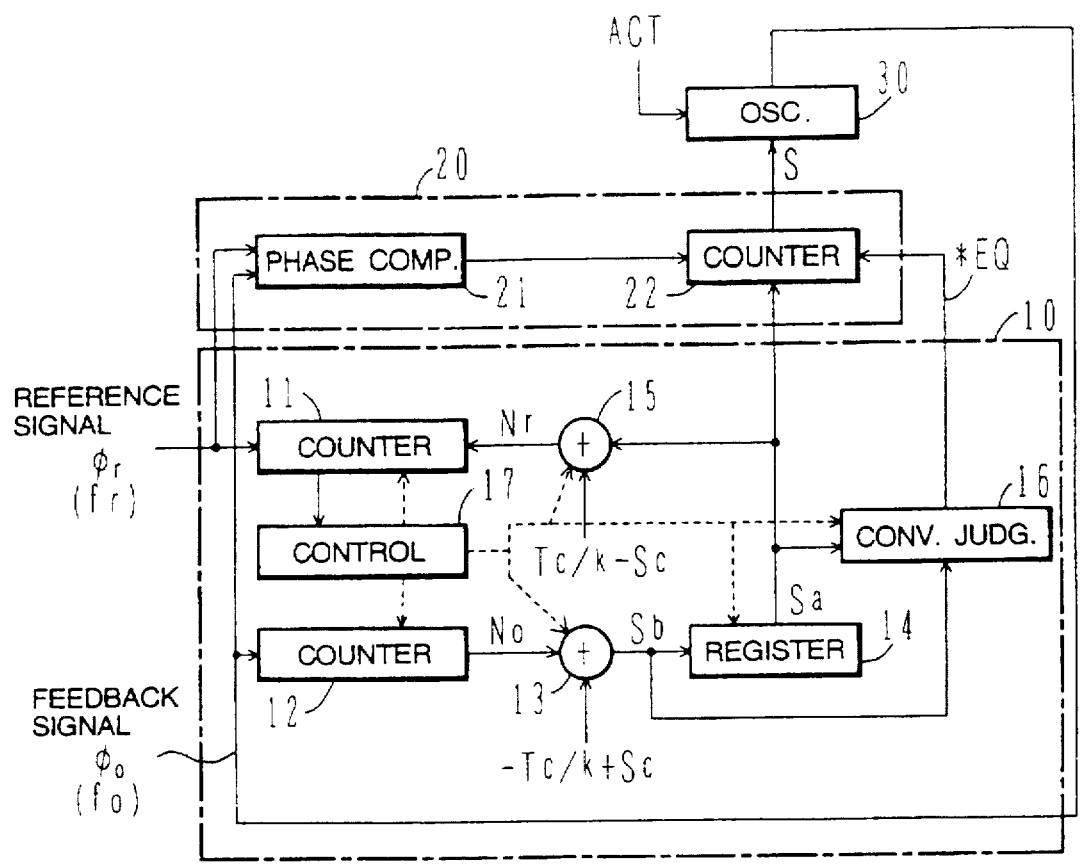
FIG. 1(A) is a block diagram of the digital PLL circuit in a first embodiment according to the present invention and FIG. 1(B) is a characteristics diagram of input and output of the oscillating circuit.
Figure 1:
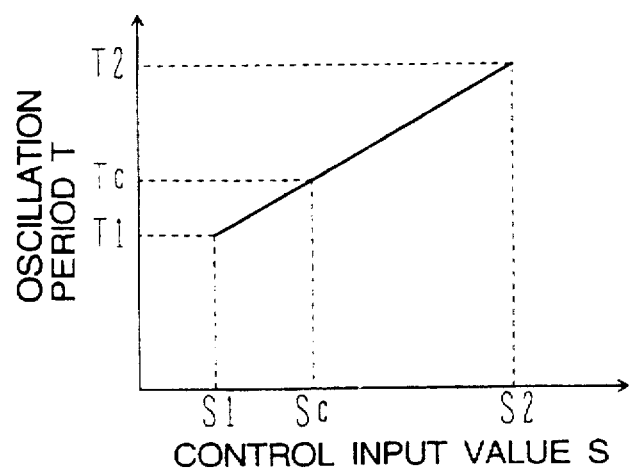

Referring now to the drawings, wherein like reference characters designate like or corresponding parts throughout several views, preferred embodiments of the present invention are described below. Signals which become active at low level will be indicated with an *.

1. First Embodiment

FIG. 1(A) shows the digital PLL circuit in a first embodiment according to the present invention.

This circuit is provided with a digital frequency control circuit 10, a digital phase control circuit 20 and an oscillating circuit 30.

The first feature of this digital PLL circuit is that an oscillating circuit 30, which outputs a signal whose cycle T may be expressed as a linear function of the control input value S, is employed, as shown in FIG. 1(B). For instance, the cycle T is expressed as $$T = k(S - Sc) + Tc, \quad (1)$$

where k, Sc and Tc are constants.

The oscillating frequency fo of the oscillating circuit 30 is expressed as $$fo = 1/T. \quad (2)$$

Figure 2:
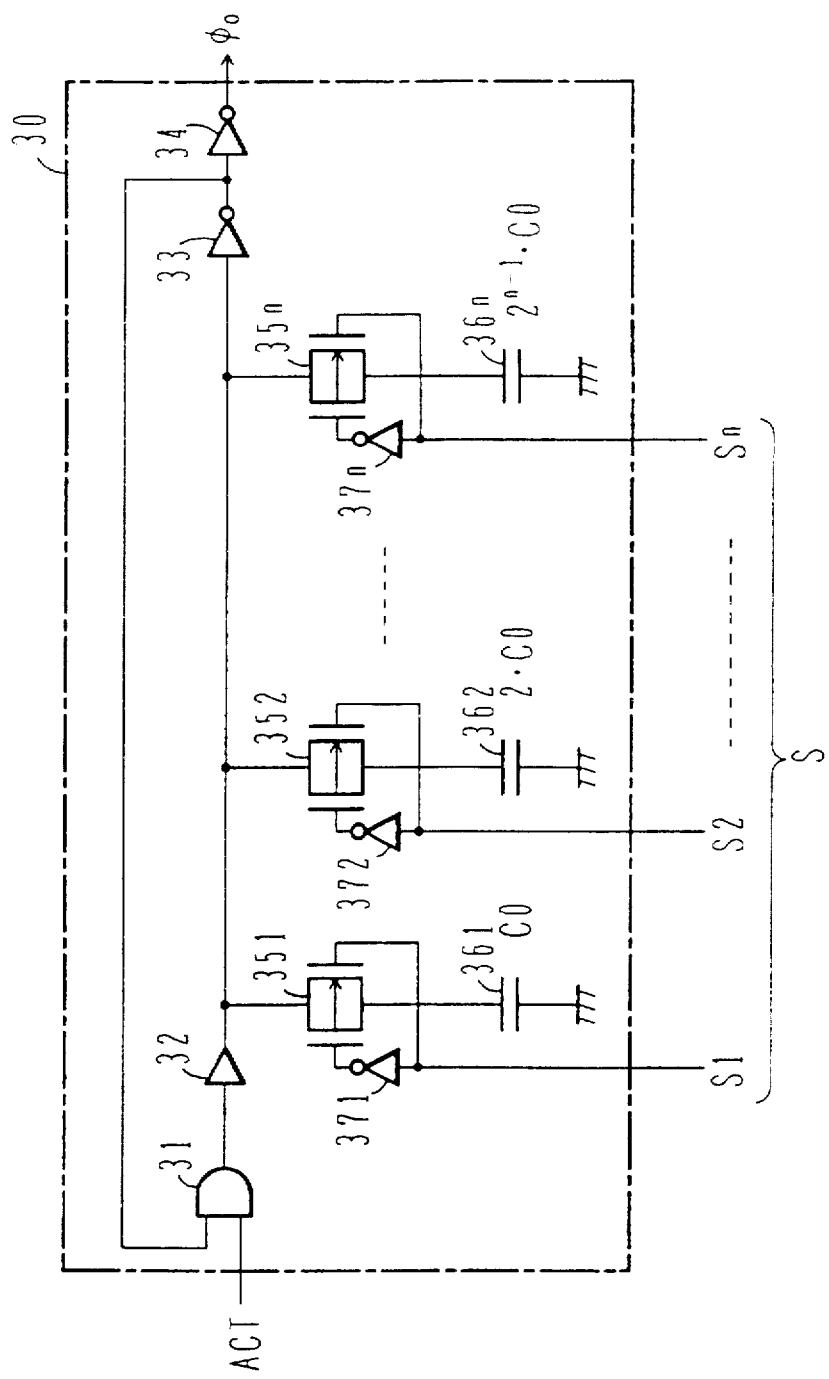
FIG. 2 shows a structural example of the oscillating circuit in FIG. 1(A)

The oscillating circuit 30 may be structured such that an input of a inverter is connected with an output of the invertor via a delay circuit so as to adjust the delay time of this delay circuit in correspondence to the control input value S. An example of this is shown in FIG. 2.

The output of an AND gate 31 is connected to one of the inputs of the AND gate 31 via a non-invertor 32 and an invertor 33, with an enable signal ACT provided to the other input of the AND gate 31. An invertor 34, which functions as a buffer, is connected to an output of the invertor 33. Between the signal line, which is located between the output of the non-invertor 32 and the input of the invertor 33, and the ground line, a configuration in which a transfer gate 35$i$ and a capacitor 36$i$ are connected in series, is connected in parallel for each i that is 1 to n. The capacity of the capacitor 36$i$ is $2^{i-1} \cdot C0$, where C0 is a constant. The transfer gate 35$i$ is constituted by connecting a pMOS transistor and an nMOS transistor in parallel with the gate of the pMOS transistor provided with a bit Si through an invertor 37$i$ and also the gate of the nMOS transistor provided with the bit Si directly. Bits S1 to Sn constitute a control input value S, where $$S=S1+2\cdot S2+2^{n-1}\cdot Sn.$$

In the structure described above, oscillation is started when the enable signal ACT is set to high and a signal $\phi_o$ output from the invertor 34 becomes a pulse train whose cycle is T determined through the Equation (1) above.

The oscillating circuit 30 may take a structure in which a frequency divider circuit for dividing the output frequency is provided at its output stage, since only the constants k and Tc in the Equation (1) change while still satisfying the relationship in Equation (1).

The second feature of the digital PLL circuit shown in FIG. 1(A) is a new processing type which is employed at the digital frequency control circuit 10 and which uses the nature of the Equation (1) above.

The digital frequency control circuit 10, for adjusting in such a manner that the frequency of the feedback signal $\phi_o$ from the oscillating circuit 30 approaches the frequency of the reference signal $\phi_r$, comprises a counter 11, a counter 12, a calculating circuit 13, a register 14, a calculating circuit 15, a convergence judging circuit 16 and a control circuit 17.

The counter 11 counts the pulses of the reference signal $\phi_r$ and notifies the control circuit 17 when the number Nr of pulses have been counted, and thereby functions as a timer. The counter 12 is used to detect the number of pulses of the feedback signal $\phi_o$ within the period of time set by this timer. The calculating circuit 13 calculates the sum Sb of the count No on the counter 12 and the constant C=−Tc/k+Sc when the counter 11 has counted the number of pulses that has been set, i.e., Nr. Sb is expressed as $$Sb=No-Tc/k+Sc. \tag{3}$$

The register 14 holds Sb as Sa and supplies this to the control input of the oscillating circuit 30 as a control input value S. The calculating circuit 15 calculates the sum Nr of Sa and the constant −C=Tc/k−Sc. Nr is expressed as $$Nr=Sa+Tc/k-Sc. \tag{4}$$

The convergence judging circuit 16 determines that the control input value S has converged when the absolute value of the difference between Sa and Sb, immediately before the register 14 holds Sb, falls under a set value. It then sets the frequency control complete signal *EQ to an active state to provide it to the digital phase control circuit 20.

The digital phase control circuit 20 comprises a phase comparator circuit 21 and a counter circuit 22. The counter circuit 22 is in a through state during the period of frequency control, i.e., while the frequency control complete signal *EQ is inactive, and Sa is provided to the control input of the oscillating circuit 30 from the register 14 via the counter circuit 22.

Figure 3:
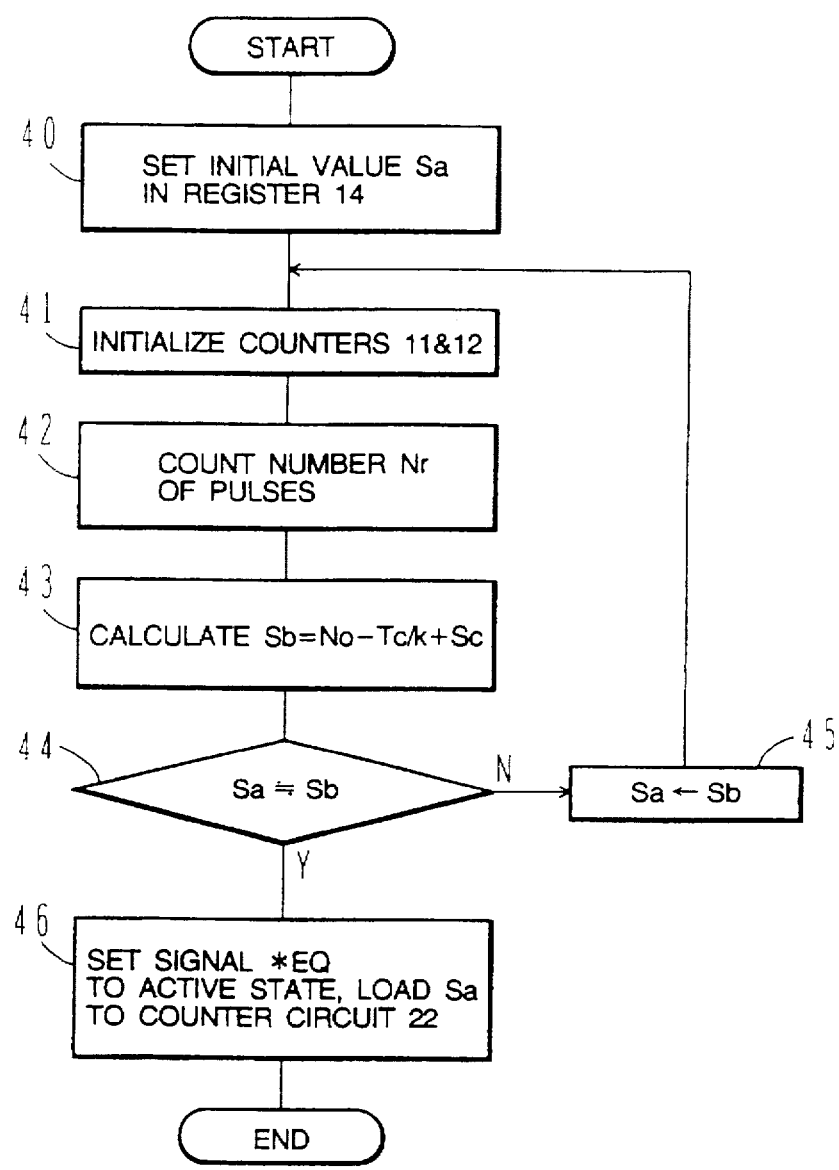
FIG. 3 is a flow chart illustrating the operation of/ the digital frequency control circuit in FIG. 1(A)

The operation of the digital frequency control circuit 10 is explained now, in reference to the flow chart shown in FIG. 3. The number in parentheses below are the step ID numbers used in FIG. 3.

(40) First, an initial value Sa is set in the register 14 by the control circuit 17. This Sa may be for instance, S2 in FIG. 1(B). Then, from the Equations (1) and (2), the frequency fo=fo0 of the feedback signal $\phi_o$ is $$fo0=1/\{k(Sa-Sc)+Tc\}. \tag{5}$$

(41) The counter 11 is initialized so that it provides a time-up signal when the counter 11 has counted the set number of pulses, Nr. For instance, MAX−Nr is loaded into the counter 11, where MAX (all bits are "1") is the maximum value of the count on the counter 11, and the carry output signal, when the count on the counter 11 has reached the maximum value MAX, is provided to the control circuit 17 as a time-up signal. At this time, the count No on the counter 12 is cleared to 0.

(42) The control circuit 17 waits for the time-up signal from the counter 11.

(43) The calculating circuit 13 executes calculation Sb=No−Tc/k+Sc.

(44) The convergence judging circuit 16 performs convergence judgement for the control input value S.

(45) If the frequency control complete signal *EQ is inactive, the control circuit 17 makes the register 14 hold Sb as Sa. At this time, based upon the Equations (1), (2) and (3) above, the frequency fo=of1 of the feedback signal $\phi_o$ is expressed as $$\begin{aligned} fo1 &= 1/\{k(Sb-Sc)+Tc\} \\ &= 1/\{k(No-Tc/k+Sc-Sc)+Tc\} \\ &= 1/(k\cdot No). \end{aligned} \tag{6}$$

Generally, $$No/fo=Nr/fr. \tag{7}$$

From the Equations (4), (5) and (7), $$\begin{aligned} No &= Nr\cdot fo0/fr \\ &= (Sa+Tc/k-Sc)/[\{(Sa-Sc)+Tc\}\cdot fr] \\ &= 1/(k\cdot fr). \end{aligned} \tag{8}$$

Therefore, from the Equations (6) and (8), $$fo1=k\cdot fr/k=fr. \tag{9}$$

This means that in principle, the frequency fo of the feedback signal $\phi_o$ matches the frequency fr of the reference signal $\phi_r$ on the first try. In actuality, since, due to deviation of the constant C=−Tc/k+Sc from the true value, the frequencies do not match on the first try, the operation returns to step 41 above and the processing in steps 41 to 45 is repeated.

(46) When a judgement is made by the convergence judging circuit 16 that Sb has converged to Sa, the frequency control complete signal *EQ is set to the active state and Sa is loaded to the counter circuit 22 as the initial value for the phase control.

If the requirement, for deciding that the frequency of the feedback signal $\phi_o$ has converged to the frequency of the reference signal $\phi_r$, is set as $$|To-Tr|<T, \tag{10}$$

this requirement is expressed as $$|No-Nr|<T\cdot No\cdot fr \tag{11}$$

by using the Equations (2) and (7). Also, since $$Nr-No=Sa-Sb \tag{12}$$

from the Equations (3) and (4),

|Sb−Sa|<T·No·fr.  (13)

Thus, when the control input value S or the count No converge, the frequency fo2 converges to the frequency fr.

Figure 4:
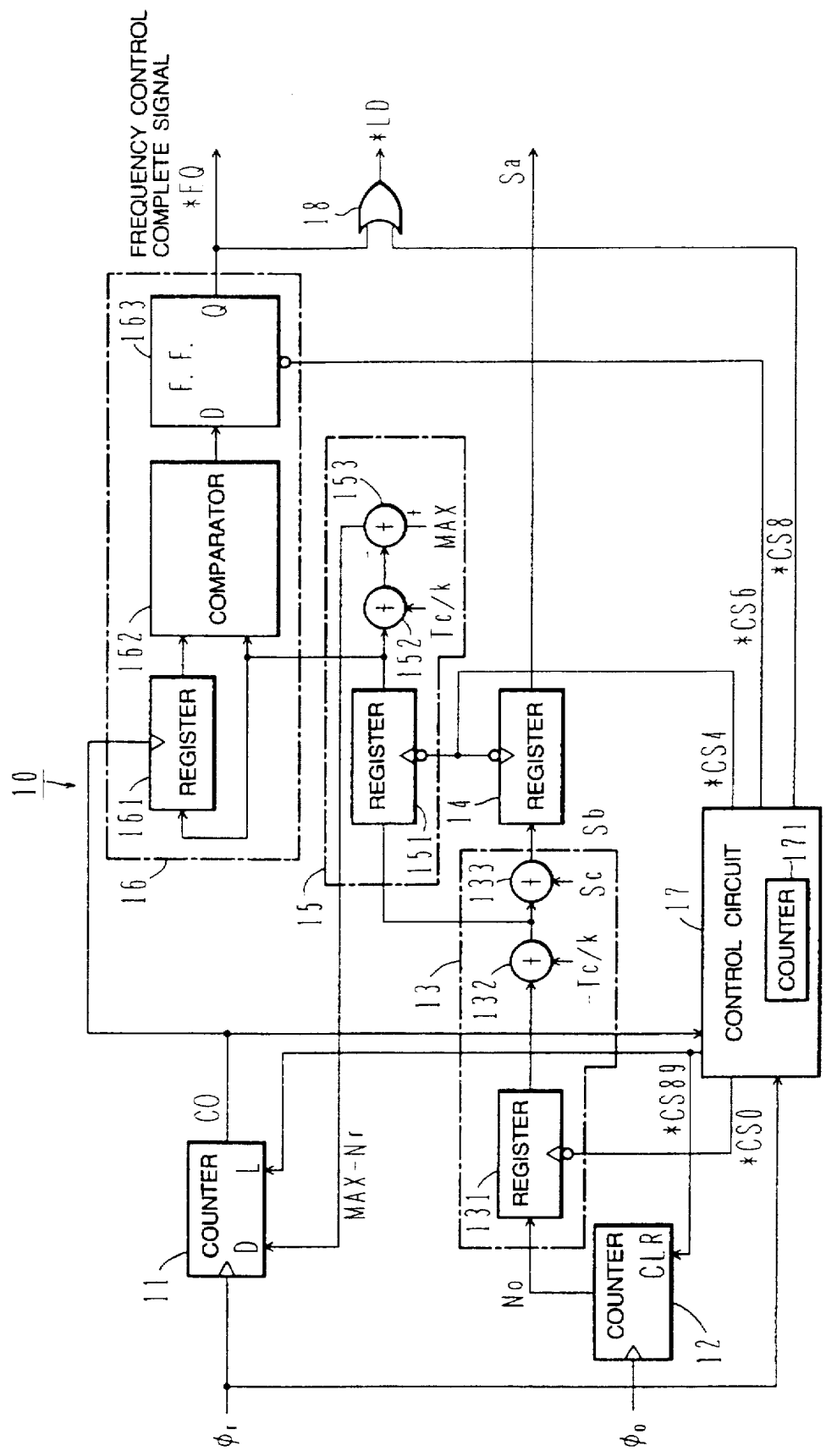
FIG. 4 is a block diagram showing a structural example of the digital frequency control circuit in FIG. 1(A)

A structural example of the digital frequency control circuit 10 is shown in FIG. 4.

The calculating circuit 13 comprises a register 131 that holds the count No of the counter 12, a adder circuit 132 which adds the contents No in the register 131 and the constant −Tc/k, and an adder circuit 133 which adds the output from the adder circuit 132 and the constant Sc. Since the frequency fo is high at, for instance, 200 MHz, it is necessary that the calculation be executed by holding the count No in the register 131. Although the adder circuit 132 and the adder circuit 133 perform calculation in real time, calculation is, in actuality, executed only when the control circuit 17 makes the register 131 hold the count No of the counter 12, and thus, power consumption in the calculating circuit 13 is reduced.

The calculating circuit 15 comprises a register 151, which holds the output from the adder circuit 132, an adder circuit 152, which adds the constant Tc/k to the contents in the register 151 and a subtractor circuit 153, which subtracts the output from the adder circuit 152 from the maximum value MAX of the counter 11.

The convergence judging circuit 16 comprises a register 161, which holds the previous value of the register 151, a comparator circuit 162, which compares the output of the register 151 to the output of the register 161 and outputs a rough match signal when the absolute value of their difference is under, for instance, 7 and a D flip-flop, which holds this signal as the frequency control complete signal *EQ.

Figure 5:
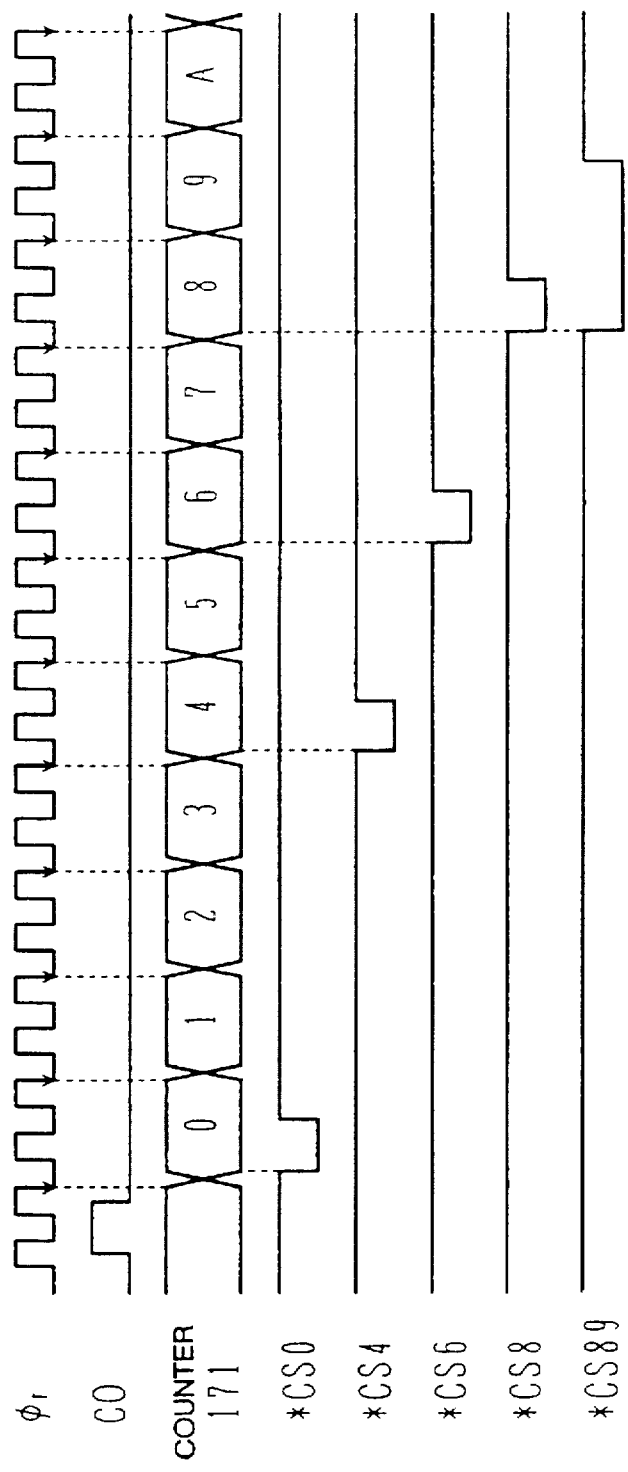
FIG. 5 is a timing chart of the input/output signals of the control circuit in FIG. 4.

The control signal 17 is provided with a counter 171 for generation of timing signals and the counter 171 is cleared to 0 when the count of the counter 11 reaches the maximum value MAX and the carry-out signal CO from the counter 11 is set to an active state. As shown in FIG. 5, the counter 171 counts the signal obtained by putting the reference signal $ø_r$ through the ½ divider circuit and when this count is at 0, 4, 6 and 8, the control circuit 17 provides the respective control signals *CS0, *CS4, *CS6 and *CS 8 as negative pulses with a width of Tr. Also the control circuit 17 provides the control signal *CS 89* as negative pulses with a width of 3Tr when the count is at 8. When its count becomes a hexadecimal value "F", the counter 171 stops counting. The load signal *LD in FIG. 4 is generated with providing the control signal *CS8 and the frequency control complete signal *EQ to an OR gate 18.

Next, the operation of the digital frequency control circuit 10 in FIG. 4 is explained.

When the count on the counter 11 reaches the maximum value MAX and the carry-out signal CO is set to active, the contents of the register 151 are held in the register 161 as the previous value and the counter 171 is cleared to 0. Next, the count No on the counter 12 is held in the register 131 with the timing of the fall of the control signal *CS0. No−Tc/k is calculated by the adder circuit 132 and (No−Tc/k)+Sc is calculated by the adder circuit 133. Then Sb is held in the register 14 and No−Tc/k is held in the register 151 with the timing of the fall of the control signal *CS4. A decision is made as to whether or not the absolute value of the difference between the current value and the previous value of (No−Tc/k) (equal to the absolute value of the difference between the current value and the previous value of the control input value S or the count No) is equal to or less than 7, for instance, by comparator circuit 162 and if the value is equal to or less than 7, the output from the comparator circuit 162 is set to low and otherwise it is set to high. (No−Tc/k) +Tc/k=No is calculated by the adder circuit 152 and MAX−No is calculated by the subtractor circuit 153. Next, the output of the comparator circuit 162 is held in the D flip-flop 163 with the timing of the fall of the control signal *CS6 and is output as the frequency control complete signal *EQ. Next the control signal *CS8 is provided to the OR gate 18 and only when the frequency control complete signal *EQ is at low, the control signal *CS8 is output from the OR gate 18 as a load signal *LD. While the control signal *CS89 is at low, (MAX−No) is loaded into the counter 11 and the counter 12 is cleared to 0.

In FIG. 1, the digital phase control circuit 20 performs control so that the phase of the feedback signal $ø_o$ approaches the phase of the reference signal $ø_r$ and is provided with a phase comparator circuit 21 and the counter circuit 22. The phase comparator circuit 21 judges as to the advance/delay of the phase of the feedback signal $ø_o$ relative to the reference signal $ø_r$ with the timing of the rise of the reference signal $ø_r$. The counter circuit 22 loads Sa as an initial value when the frequency control complete signal *EQ has become active, counts the pulses from the phase comparator circuit 21 and supplies the count to the control input of the oscillating circuit 30 as the control input value S.

Figure 6:
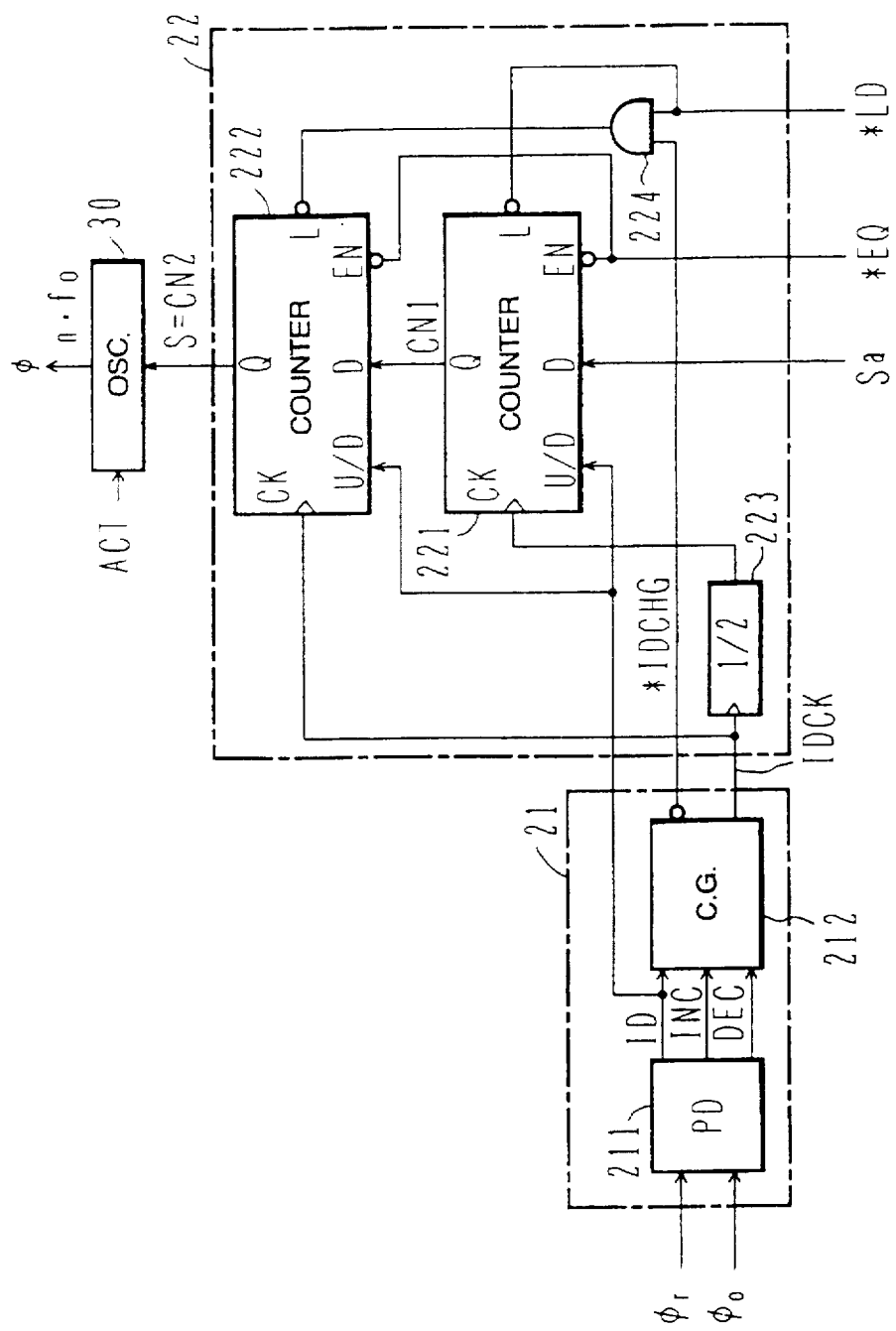
FIG. 6 is a block diagram of a structural example of the digital phase control circuit in FIG. 1(A)

A structural example of the digital phase control circuit 20 is shown in FIG. 6.

Figure 7:
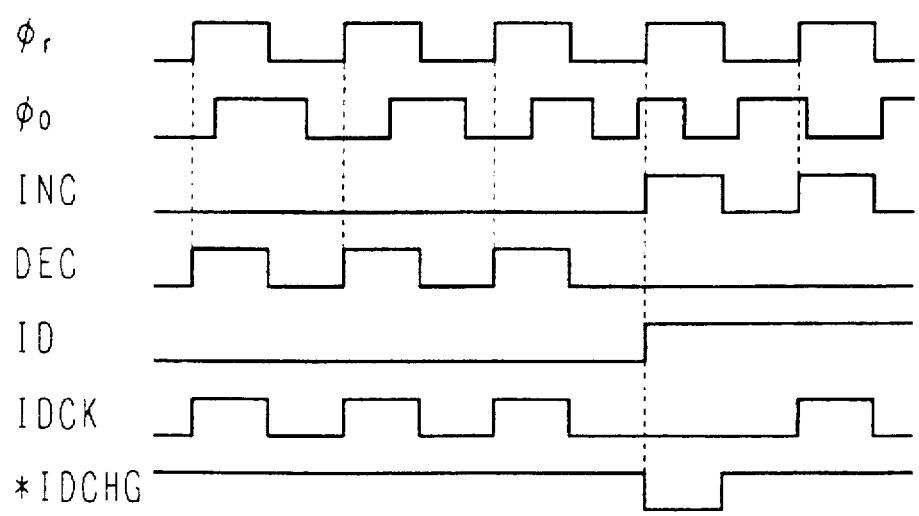
FIG. 7 is a timing chart of the input/output signals of the phase comparator circuit in FIG. 6.

The phase comparator circuit 21 comprises a phase comparator circuit 211 and a clock generator circuit 212. The phase comparator circuit 211 generates signals DEC, INC and ID based upon the reference signal $ø_r$ and the feedback signal $ø_o$. As shown in FIG. 7, the signal DEC is a pulse that is generated with the timing of the rise of the reference signal $ø_r$ when the feedback signal $ø_o$ is at low, the signal INC is a pulse generated with the timing of the rise of the reference signal $ø_r$ when the feedback signal $ø_o$ is at high and the signal ID is a signal that is reset by the signal DEC and set by the signal INC.

In FIG. 6, the clock generator circuit 212 generates signals *IDCHG and IDCK based upon the signals DEC, INC and ID. As shown in FIG. 7, the signal *IDCHG is a negative pulse generated when the edge of the signal ID is detected and the signal IDCK is a signal created by removing a positive pulse that corresponds to the negative pulse of the signal *IDCHG from the pulse train of the OR of the signal INC and the signal DEC.

In FIG. 6, the counter circuit 22 is provided with a U (up)/D (down) counter 221 to the data input D of which Sa is provided, a U/D counter 222, the data input D of which is connected to the data output Q of the U/D counter 221, a ½ frequency divider circuit 223, which divides the frequency of the signal IDCK and an AND gate 224. The data output Q of the U/D counter 222 is connected to the control input of the oscillating circuit 30.

The frequency control complete signal *EQ is provided to the enable signal inputs EN of the U/D counters 221 and 222, and while the frequency control complete signal *EQ is inactive, i.e., during the frequency control, counting on the U/D counters 221 and 222 is stopped.

The load signal *LD is provided to a load control input L of the U/D counter 221 and when the load signal *LD is at low, Sa is loaded to the U/D counter 221 and is taken out from the data output Q. When the load signal *LD is at low, the load control input L of the U/D counter 222 is also set to low, the output data from the U/D counter 221 are loaded to the U/D counter 222 and are taken out from the data output Q. Consequently when the load signal *LD is at low, the U/D counters 221 and 222 are in a through state and Sa travels through the U/D counters 221 and 222 to be provided to the control input of the oscillating circuit 30.

The signal ID is provided to the up/down mode inputs U/D of the U/D counters 221 and 222 and, in order to shift the rising edge of the feedback signal $\phi_o$ toward the rising edge of the reference signal $\phi_r$, the U/D counters 221 and 222 are set in the down mode when the signal ID is at low, i.e., when the phase of the feedback signal $\phi_o$ relative to the reference signal $\phi_r$ is delayed and in the reverse situation they are set in the up mode.

The signal IDCK is counted by the U/D counter 222 and the output from the ½ frequency divider circuit 223 is counted by the U/D counter 221. The signal *IDCHG and the load signal *LD are provided to the AND gate 224, the output from the AND gate 224 is provided to the load control input L of the U/D counter 222 and when either the load signal *LD or the signal *IDCHG is at low, the count CN1 on the U/D counter 221 is loaded to the U/D counter 222.

Figure 8:
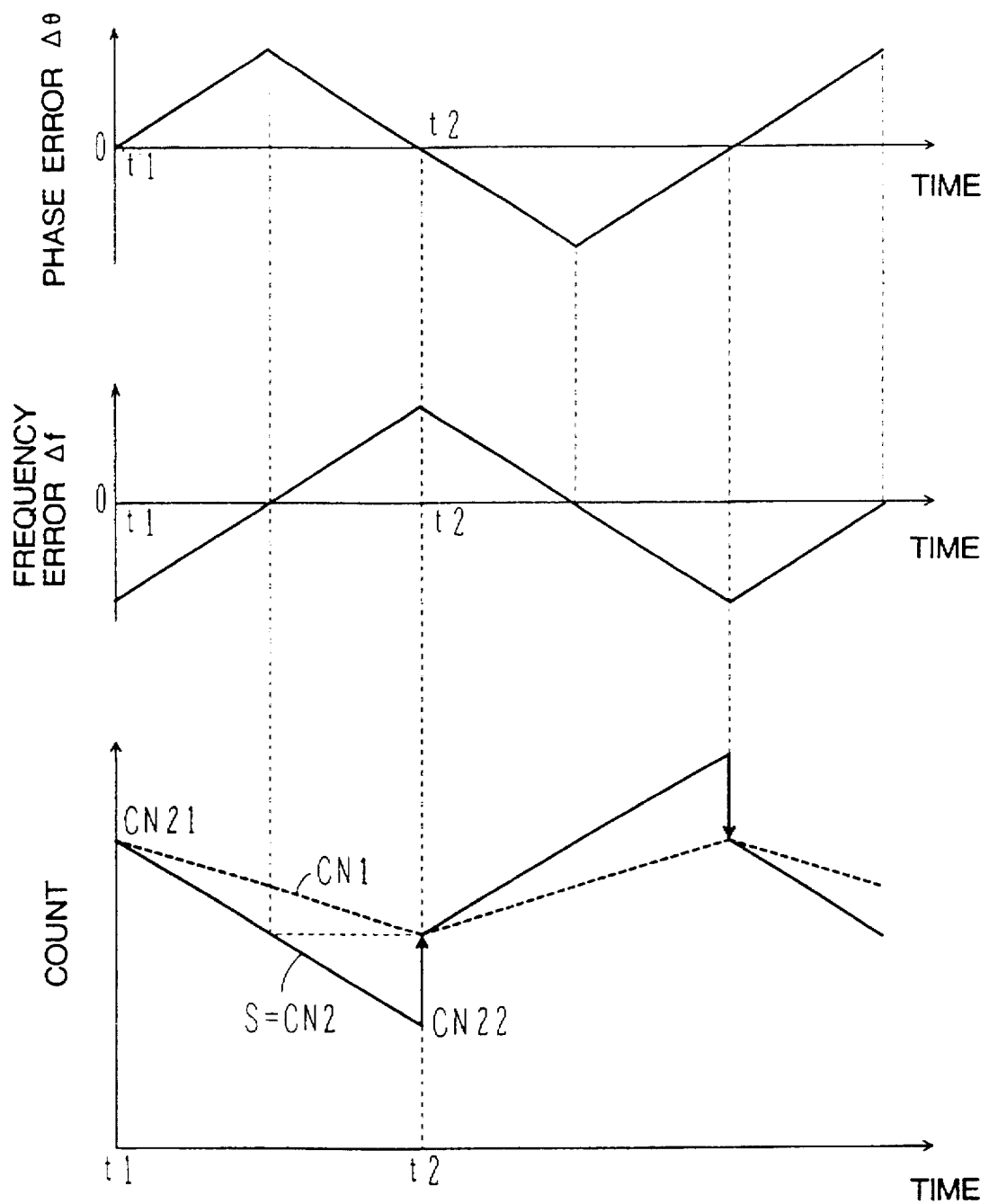
FIG. 8 is a schematic chart of the operation performed by the circuit shown in FIG. 6, showing changes in the phase error $\Delta\theta$ and the frequency error $\Delta f = fo - fr$ of the feedback signal $\phi_o$ relative to the reference signal or and changes in the count CN1 and CN2.

FIG. 8 shows a outline of the operation of the circuit shown in FIG. 6.

When the phase error $\Delta\theta$ of the feedback signal $\phi_o$ relative to the reference signal $\phi_r$ is positive (when ID is at low), the frequency error $\Delta f = f_o - f_r$ goes up (To decreases) and the counts CN1 and CN2 are reduced. When $\Delta\theta = 0$, the frequency fo has increased too much. When the change rate of $\Delta\theta$ is at 0, frequency error $\Delta f = 0$. The count CN2 corresponding to the frequency fo at this time is approximately equal to the average value of the count CN21 at the time point t=t1 and the count CN22 at the time point t=t2 and the average value (CN 21+CN22)/2 is equal to the count CN1 at the time point t=t2. Since the count CN1 on the U/D counter 221 is loaded to the U/D counter 222 to equalize CN2=CN1 at the time point t=t2, the accuracy of the phase control is improved. This is the third feature of the digital PLL circuit shown in FIG. 1(A).

When the phase control is in a steady state, the phase error $\Delta\theta$ and the frequency error f oscillate, offset from each other by approximately $\pi/2$.

Figure 9:
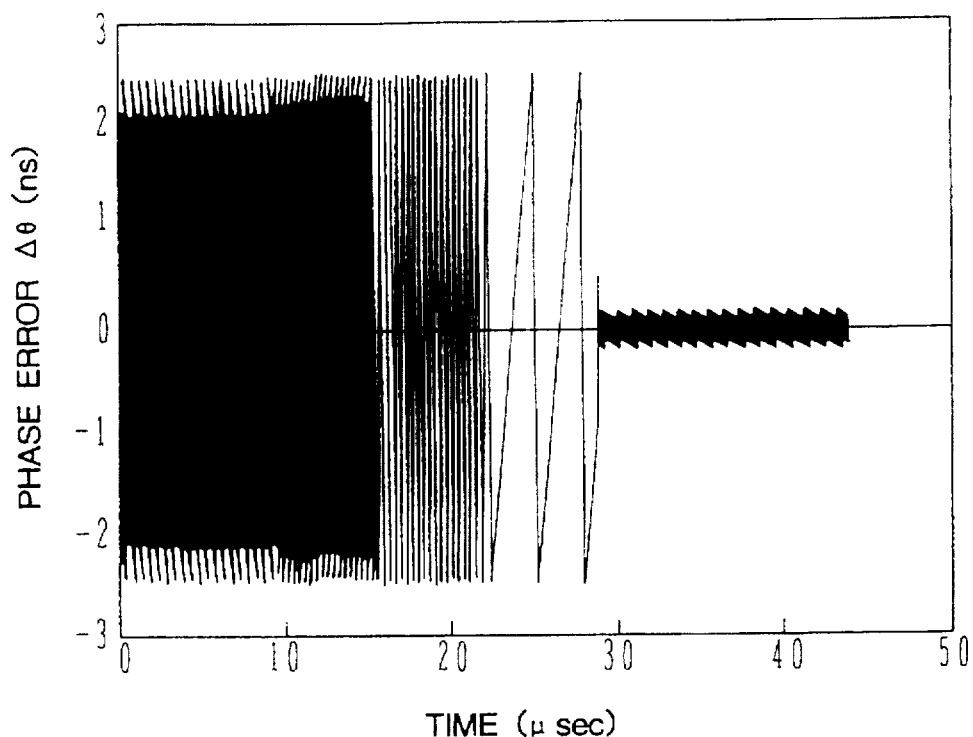
Figure 9:
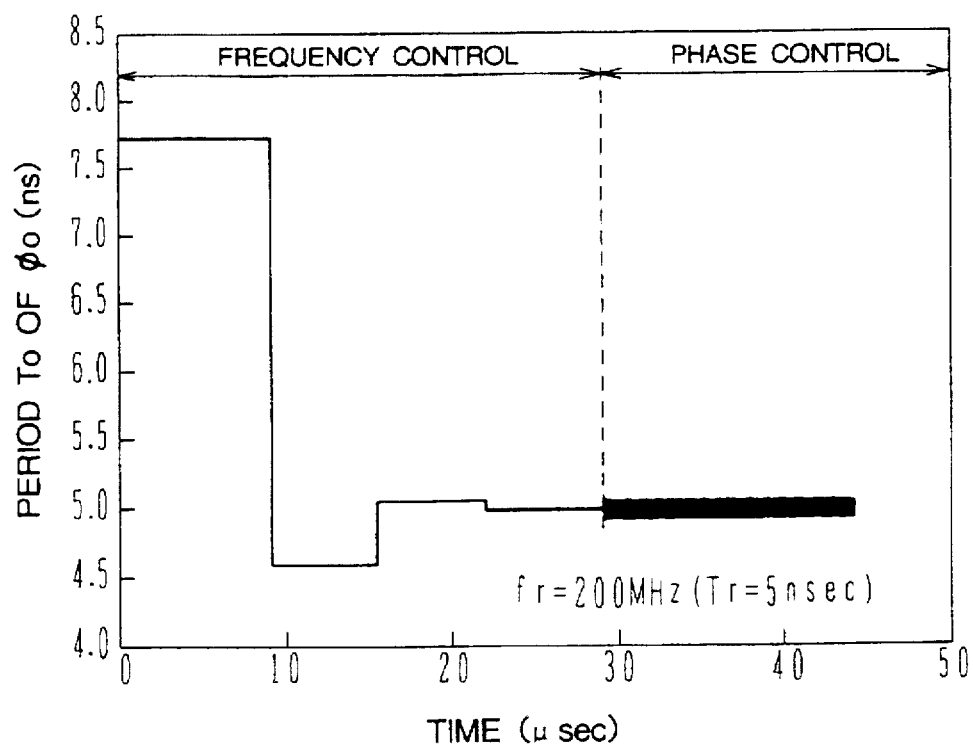
Figure 10:
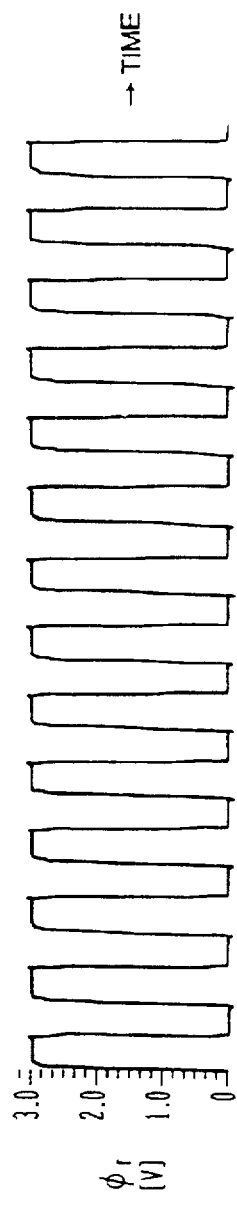
FIGS. 10(A) to 10(D) show the results of a simulation performed under conditions identical to those in FIG. 9 and show waveform diagrams of the reference signal $\phi_r$, the feedback signal $\phi_o$ and the signals INC and DEC during the phase control.
Figure 10:
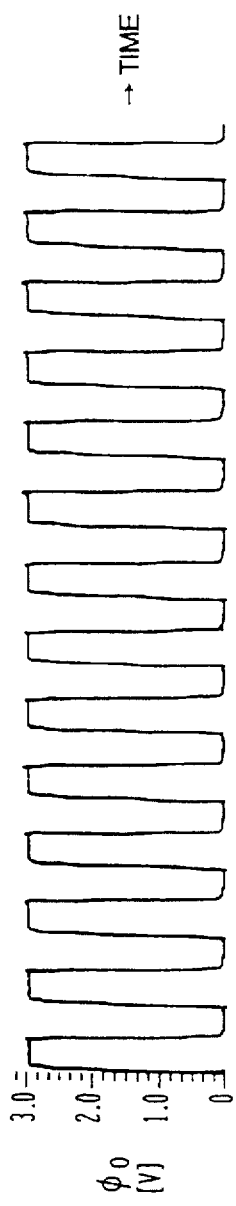
Figure 10:
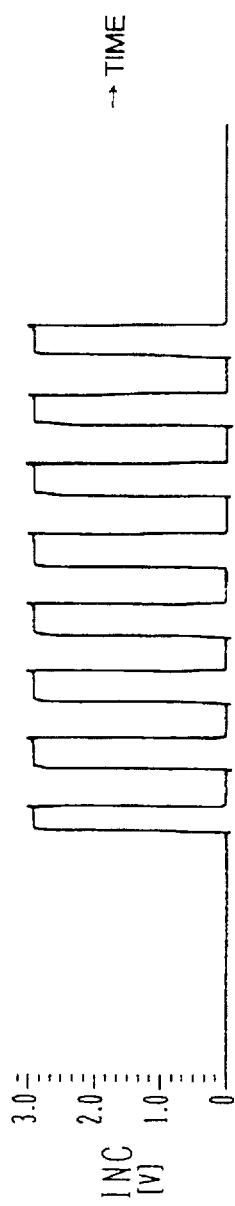
Figure 10:
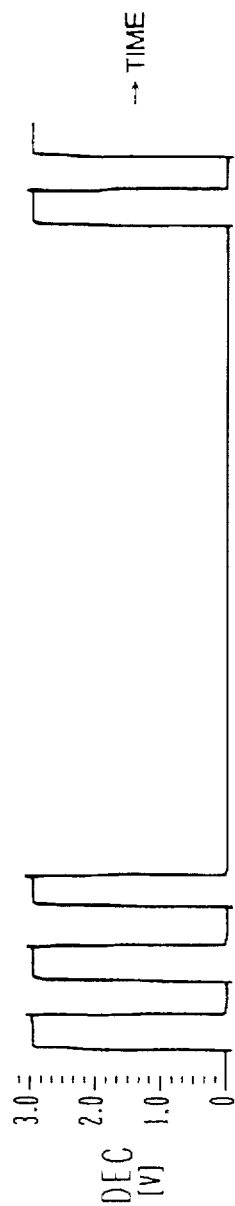

FIGS. 9(A), 9(B) and 10 show the results of a simulation performed when the circuits shown in FIG. 4 and FIG. 6 are used in the digital PLL circuit in FIG. 1(A) with fr at 200 MHz (Tr=5 nsec) and the source voltage at 3.0 V.

FIG. 9(A) shows the change in the phase error $\Delta\theta$ of the feedback signal $\phi_o$ relative to the reference signal $\phi_r$ and FIG. 9(B) shows the change in the cycle To of the feedback signal $\phi_o$.

As FIG. 9(A) clearly shows, the phase error $\Delta\theta$ oscillates during frequency control within the range of $-\pi$ to $\pi$, i.e., within the range of $-2.5$ nsec to $2.5$ nsec and its oscillating cycle becomes lengthened as the frequency fo approaches the frequency fr. The frequency control is completed within a short period of time, approximately 30 μsec. In addition, the phase control, too, enters a steady state very quickly and oscillation of $\Delta\theta$ at short cycles is in the range of approximately ±200 psec during the phase control.

As FIG. 9(B) clearly shows, the cycle To approaches the target value of 5 nsec during the frequency control in steps of time width 10 μsec or shorter and oscillates near the target value during the phase control.

FIGS. 10(A) to 10(C) shows changes in the reference signal $\phi_r$, the feedback signal $\phi_o$ and the signals INC and DEC during the phase control.

Figure 11:
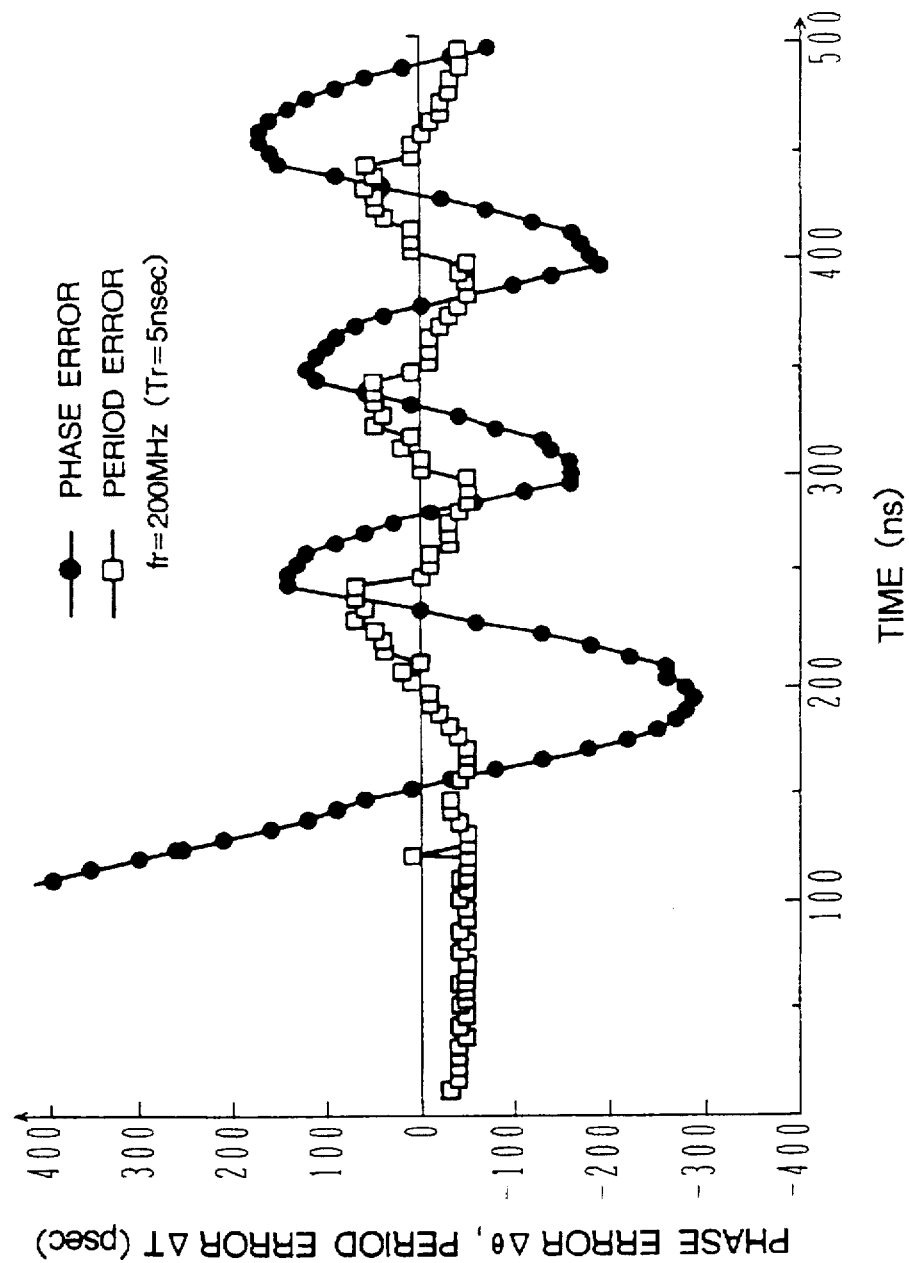
FIG. 11 shows the results of a simulation performed under conditions identical to those in FIG. 9 and is a waveform diagram based upon the measurements of the phase error $\Delta\theta$ and the cycle error T of the feedback signal $\phi_o$ relative to the reference signal or during the initial stage of the phase control.

FIG. 11 shows changes in the phase error $\Delta\theta$ and the cycle error T of the feedback signal $\phi_o$ relative to the reference signal $\phi_r$ during the initial period of the phase control and it is clear that the phase control enters the steady state within an extremely short period of time. Furthermore, the accuracy of the phase control is high at 200 psec/5 nsec=0.04 or lower.

2. Second Embodiment

Figure 12:
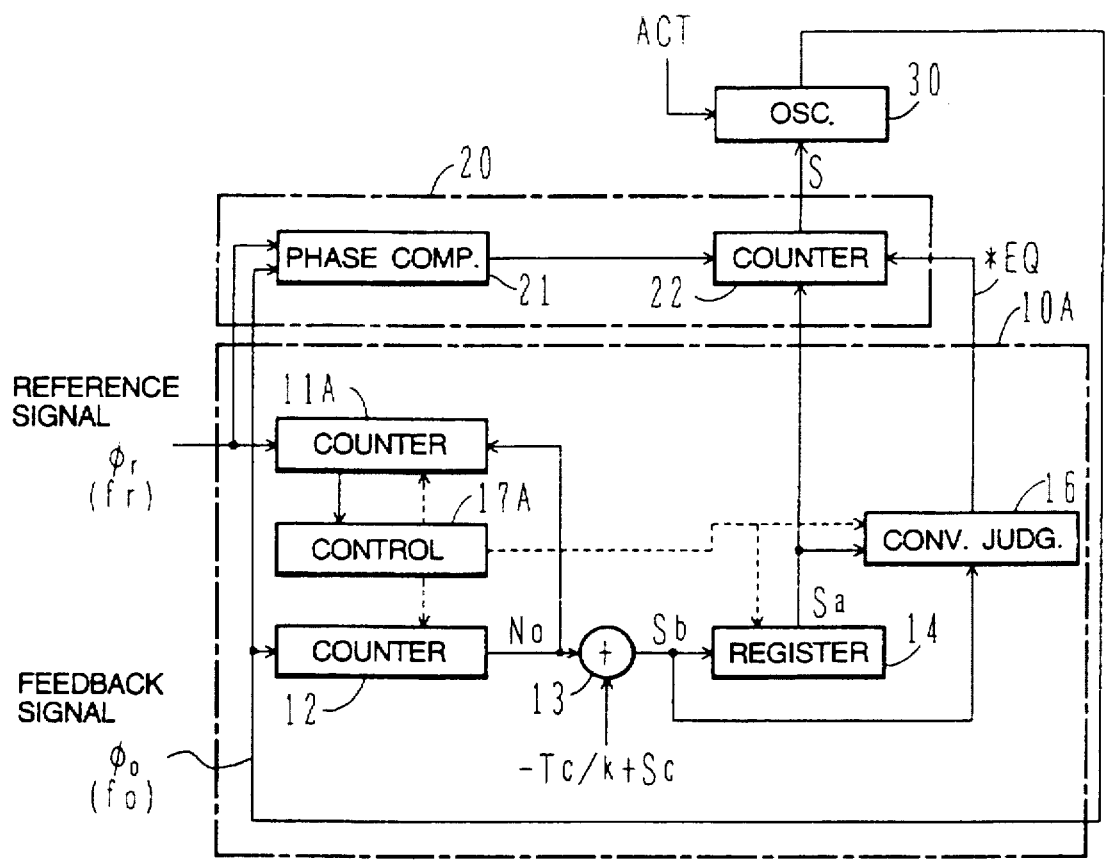
FIG. 12 is a block diagram of the digital PLL circuit in a second embodiment according to the present invention.

FIG. 12 shows the digital PLL circuit according to the present invention in a second embodiment.

Since the output Nr, except for its initial value, from the calculating circuit 15 in FIG. 1(A) is equal to the count No, in the digital frequency control circuit 10A in FIG. 12, the calculating circuit 15 register 14 is omitted. The initial value is loaded to a down counter 11A from a control circuit 17A. When the count on the down counter 11A has reached 0, the control circuit 17A makes the down counter 11A load with the count No on the counter 12.

The second embodiment is identical to the first embodiment in all other respects.

3. Third Embodiment

Figure 13:
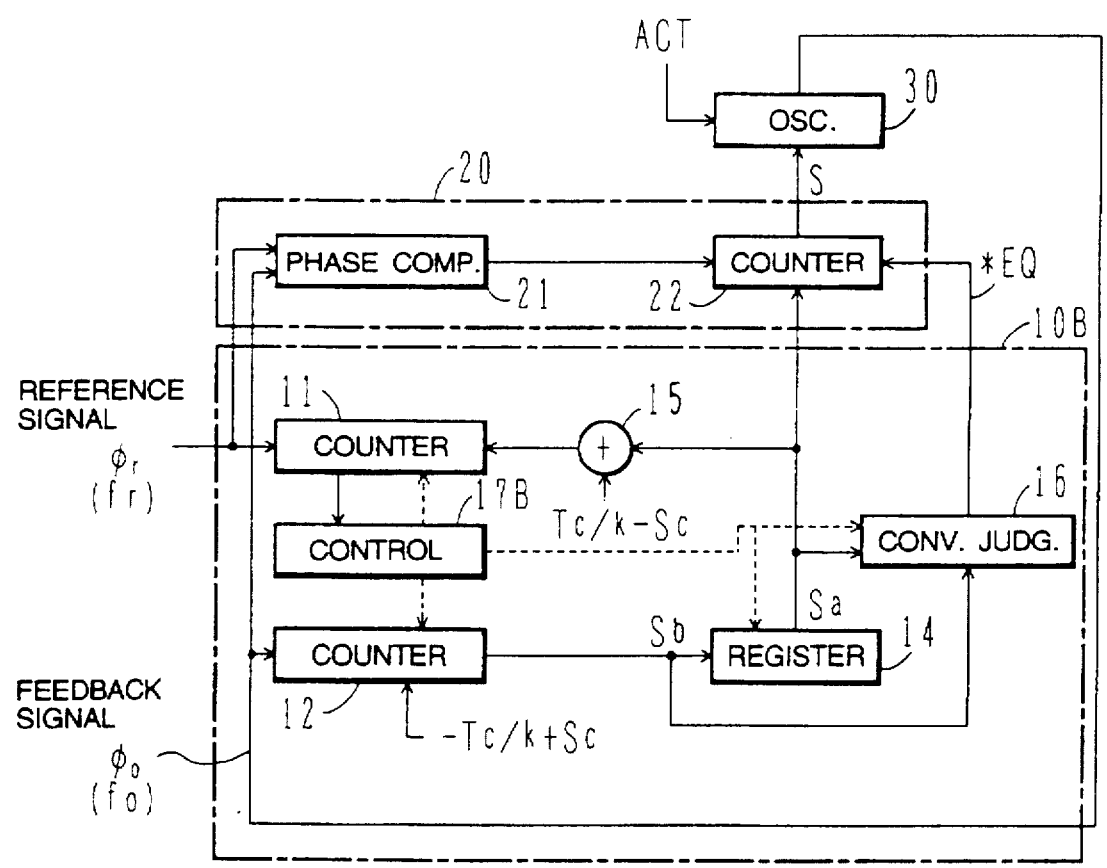
FIG. 13 is a block diagram of the digital PLL circuit in a third embodiment according to the present invention.

FIG. 13 shows the digital PLL circuit according to the present invention in a third embodiment.

In a digital frequency control circuit 10B, by loading $-Tc/k+Sc$ to the counter 12 instead of clearing the counter 12 to 0, the calculating circuit 13 in FIG. 1(A) is omitted.

The third embodiment is identical to the first embodiment in all other respects.

Although preferred embodiments of the present invention has been described, it is to be understood that the invention is not limited thereto and that various changes and modifications may be made without departing from the spirit and scope of the invention.

For instance, the phase comparator circuit 21 may judge the advance/delay of the phase of the feedback signal $\phi_o$ relative to the reference signal $\phi_r$ either with the timing of the fall of the reference signal $\phi_r$ or the feedback signal $\phi_o$ or with the timing of the rise of the feedback signal $\phi_o$.

Also, the convergence judging circuit 16 may take a structure in which judgement on the convergence of the control input value S is performed based upon the absolute value of the difference between the current value and the previous value on the counter 12. In FIG. 4, a structure in which the output from the register 131 is held in the register 151, omitting the adder circuit 152 is also acceptable.

In relation between the digital phase control circuit 20 and the oscillating circuit 30, the circuit 30 may outputs a signal whose frequency f is a linear function of the control input value S. In this case, inverted signal of ID is used for U/D mode inputs of counters 221 and 222 in FIG. 6.

What is claimed is:

1. A digital frequency control circuit for controlling in such a way that a frequency of an output signal of an oscillating circuit approaches a frequency of a reference signal, a pulse cycle T of said output signal being approximately a linear function of a control input value S, namely T=kS+m, comprising:

a first counter counting pulses of said reference signal;

a second counter counting pulses of said output signal as a feedback signal;

a register holding said control input value S; and a calculation and control circuit, when said first counter have counted a number Nr of pulses, calculating S=No−m/k, where No being a count of said second counter, making said register hold S, equalizing said number Nr for a next value to No and initializing the count No.

2. A digital frequency control circuit according to claim 1, wherein said calculation and control circuit comprises:

a first calculating circuit calculating S=No−m/k;

a second calculating circuit calculating Nr−S+m/k; and a control circuit, when said first counter have counted said number Nr of pulses, making said register hold an output of said first calculating circuit, equalizing said number Nr for said next value to an output of said second calculating circuit and clearing said second counter to 0.

3. A digital frequency control circuit for controlling in such a way that a frequency of an output signal of an oscillating circuit approaches a frequency of a reference signal, a pulse cycle T of said output signal being approximately a linear function of a control input value S, namely T=kS+m, comprising:

a first counter counting pulses of said reference signal;

a second counter counting pulses of said output signal as a feedback signal;

a register holding said control input value S;

a calculating circuit calculating S=No−m/k wherein No being a count of said second counter; and a control circuit, when said first counter have counted a number Nr of pulses, making said register hold an output of said calculating circuit, equalizing said number Nr for a next value to said count No and clearing said second counter to 0.

4. A digital frequency control circuit for controlling in such a way that a frequency of an output signal of an oscillating circuit approaches a frequency of a reference signal, a pulse cycle T of said output signal being approximately a linear function of a control input value S, namely T=kS+m, comprising:

a first counter counting pulses of said reference signal;

a second counter counting pulses of said output signal as a feedback signal;

a register holding said control input value S;

a calculating circuit calculating Nr=S+m/k; and a control circuit, when said first counter have counted said number Nr of pulses, making said register hold a count of said second counter, equalizing said number Nr for a next value to an output of said calculating circuit and loading m/k to said second counter.

5. A digital frequency control circuit according to claim 2, wherein:

said first calculating circuit includes a buffer register for holding No; and said control circuit causes said first calculating circuit to execute calculations by making said buffer register hold No when said first counter has counted the number of Nr pulses.

6. A digital frequency control circuit according to claim 2, wherein:

said second calculating circuit includes a buffer register for holding Nr; and said control circuit causes said second calculating circuit to execute calculations by making said buffer register hold Nr when said first counter has counted a number Nr of pulses.

7. A digital frequency control circuit according to claim 1, further comprising a convergence judging circuit judging whether or not said frequency of said feedback signal relative to a frequency of said reference signal has converged based upon an absolute value of a difference between an input value and an output value of said register when said first counter has counted said number Nr of pulses.

8. A digital frequency control circuit according to claim 1 wherein:

said calculation and control circuit, when said first counter outputs a carry-out signal, calculates MAX−Nr, where MAX is a maximum count value of said first counter, and loads said first counter with MAX−Nr; and said first counter is an up-counter.

9. A digital frequency control circuit according to claim 1 wherein:

said first counter comprises a down-counter; and said calculation and control circuit loads said first counter with No when a count of said first counter has reached 0.

10. A digital phase control circuit for controlling a phase error between a phase of an output signal of an oscillating circuit and a phase of a reference signal, a pulse cycle of said output signal being changed in response to a control input value S, said digital phase control circuit comprising:

a phase comparator circuit judging a phase advance/delay of said output signal as a feedback signal relative to a phase of said reference signal; and a counter circuit counting up or down according to a result of a judgement by said phase comparator circuit and changing a count, when the result of the judgement has been reversed, to approximately an average value of first and last counts in previous successive same results of the judgements, said count being used as said control input value S.

11. A digital phase control circuit according to claim 10, wherein said phase comparator circuit judges the phase advance/delay of said feedback signal relative to said phase of said reference signal, with a timing of an edge of a pulse of either said reference signal or said feedback signal, by detecting a logical level of the other pulse of said reference signal and said feedback signal.

12. A digital phase control circuit according to claim 11, wherein said phase comparator circuit outputs a first pulse signal when said judgement is performed, outputs a status signal holding a result of said judgement.

13. A digital phase control circuit according to claim 12, wherein said counter circuit includes:

a ½ frequency divider circuit having an input receiving said first pulse signal and having an output providing a second pulse signal;

a first up/down counter having an up/down mode input receiving said status signal, having a clock input receiving said second pulse signal; and a second up/down counter having an up/down mode input receiving said status signal, having a clock input receiving said first pulse signal, having a load control input receiving a change pulse signal, having a parallel data input receiving a count of said first up/down counter and having a parallel data output providing said control input value S.

14. A digital PLL circuit, comprising:

an oscillating circuit providing an output signal, a pulse cycle T of said output signal being changed in response to a control input value S;

a phase comparator circuit judging a phase an advance/delay of said output signal as a feedback signal relative to a phase of a reference signal; and a counter circuit counting up or down according to a result of a judgement by said phase comparator circuit and changing a count, when the result of the judgement has been reversed, to a value that is approximately an average value of first and second counts in previous successive same results of the judgements, said count being used as said control input value S.

15. A digital PLL circuit according to claim 14, wherein said pulse cycle T of said output signal being approximately a linear function of said control input value S, namely T=kS+m.

16. A digital PLL circuit according to claim 15, further comprising:

a first counter counting pulses of said reference signal;

a second counter counting pulses of said feedback signal;

a register holding said control input value S;

a convergence judging circuit judging whether or not a frequency of said feedback signal relative to a frequency of said reference signal has converged; and a calculation and control circuit, when said first counter have counted a number Nr of pulses, making said register hold S=No−m/k, where No being a count number of said second counter and equalizing said number Nr for a next value to No, initializing the count No and selecting an output of said register as said control input value S before a convergence judgement of said frequency is made.

17. A digital PLL circuit, comprising:

an oscillating circuit providing an output signal, a frequency of said output signal being changed in response to a control input value S;

a digital frequency control circuit, providing a first control signal in response to said output signal and a reference signal, and controlling in such a way that said frequency of said output signal approaches a frequency of the reference signal;

a frequency convergence judgement circuit judging a convergence of said first control signal;

a phase comparator circuit judging advance/delay of a phase of said output signal relative to a phase of the reference signal; and a counter circuit counting up or down a count according to a judgement of said phase comparator circuit, said counter circuit providing said first control signal as said control input value S when said frequency convergence judgement circuit not judging said convergence of said first control signal, said counter providing said count as said control input value S after said frequency convergence judgement circuit having judged said convergence of said first control signal.

18. A semiconductor device, comprising:

a first counter counting pulses of a reference signal;

a second counter counting pulses of a feedback signal;

a register holding a control input value S; and a calculation and control circuit, when said first counter have counted a number Nr of pulses, calculating S=No−m/k, where No being a count of said second counter, making said register hold S and equalizing said number Nr for a next value to No.

19. A semiconductor device, comprising:

a phase comparator circuit judging a phase advance/delay of a feedback signal relative to a phase of a reference signal; and a counter circuit counting up or down according to a result of a judgement by said phase comparator circuit and changing a count, when the result of the judgement has been reversed, to a value that is approximately an average value of first and last counts in previous successive same results of the judgements.

* * * * *

UNITED STATES PATENT AND TRADEMARK OFFICE
CERTIFICATE OF CORRECTION

PATENT NO. : 5,777,499
DATED : July 7, 1998
INVENTOR(S) : Takaishi

It is certified that error appears in the above-identified patent and that said Letters Patent is hereby corrected as shown below:

Col. 3, line 56, change "$\Delta\theta$ to --$\Delta f$--.

Col. 5, line 65, change "signals" to --signal $\phi_o$--.

Signed and Sealed this

Nineteenth Day of January, 1999

Attest:

Attesting Officer

Acting Commissioner of Patents and Trademarks